United States Patent
Hino et al.

[11] Patent Number: 6,157,084
[45] Date of Patent: Dec. 5, 2000

[54] FILM CARRIER AND SEMICONDUCTOR DEVICE USING SAME

[75] Inventors: Atsushi Hino; Toshiki Naito; Masakazu Sugimoto, all of Ibaraki, Japan

[73] Assignee: Nitto Denko Corporation, Osaka, Japan

[21] Appl. No.: 08/913,571

[22] PCT Filed: Mar. 17, 1995

[86] PCT No.: PCT/JP95/00493

§ 371 Date: Sep. 17, 1997

§ 102(e) Date: Sep. 17, 1997

[51] Int. Cl.[7] .......................... H01L 23/48; H01L 23/52; H01L 23/40

[52] U.S. Cl. .......................... 257/773; 257/778; 257/698

[58] Field of Search .................... 257/778, 700, 257/698, 773

[56] References Cited

U.S. PATENT DOCUMENTS

| | | |
|---|---|---|
| 4,941,033 | 7/1990 | Kishida . |
| 5,049,972 | 9/1991 | Uda et al. . |
| 5,360,988 | 11/1994 | Uda et al. . |
| 5,475,236 | 12/1995 | Yoshizaki . |
| 5,523,622 | 6/1996 | Harada et al. . |
| 5,677,567 | 10/1997 | Ma et al. . |
| 5,877,559 | 3/1999 | Takayama et al. . |

*Primary Examiner*—Sheila V. Clark
*Attorney, Agent, or Firm*—Sughrue, Mion, Zinn, Macpeak & Seas, PLLC

[57] ABSTRACT

A semiconductor device capable of meeting the demand for fine-pitched wiring of semiconductor element and highly dense mounting thereof, as well as the demand for a thin structure thereof, which device being superior in the adhesion property of an insulating resin to be used for sealing a semiconductor element and a film carrier, and thus highly reliable. In FIG. 1, a conductive circuit (5) is embedded so that it will not be exposed at the both surfaces (6a, 6b) of an insulator layer (6), and conductive paths (7, 8) are formed in a pair from the both surfaces (5a, 5b) of the conductive circuit (5), the conductive paths slipping relative to each other in the direction of the surface of the conductive circuit (5). The conductive paths (7, 8) are respectively connected to bumps (9, 10), and the conductive circuit (5) and bumps (9, 10) are conducted via conductive paths (7, 8). The bump (9) formed on one end of the one conductive path (7) of the film carrier (2) contacts an electrode (12) of the semiconductor element (3) and is electrically connected, whereby the semiconductor element (3) is mounted on the film carrier (2). An insulating resin layer (4) is formed on one surface (6a) of the insulator layer (6) to cover the semiconductor element (3).

18 Claims, 6 Drawing Sheets

FILM CARRIER AND SEMICONDUCTOR DEVICE USING SAME

TECHNICAL FIELD

The present invention relates to a film carrier for mounting a semiconductor element, and to a semiconductor device comprising a semiconductor element mounted on this film carrier.

BACKGROUND ART

There has been conventionally employed a film carrier method for mounting a semiconductor element, wherein a metal protrusion for connection purposes (hereinafter this protrusion is referred to as a bump) is used for the inner bonding between a lead on a film carrier and an electrode of a semiconductor element.

When the above-mentioned bump is formed on an electrode of a semiconductor element, however, a metal layer of titanium, chromium and the like for adhesion, and a metal layer of copper, platinum, palladium and the like as a barrier for preventing diffusion of bump metal are formed on the electrode surface by sputter-etching, evaporation and the like, on which a bump of gold and the like is formed, thus making the process extremely complicated. Moreover, there is a likelihood that the semiconductor element and/or electrode surface may be contaminated or damaged during the process of forming a bump on the electrode surface.

A method has been proposed which uses an anisotropic conductive film having conductivity in the thickness direction of a film, for bonding without forming a bump on an electrode surface. Specifically, that wherein conductive particles of carbon black, graphite, nickel, copper, silver and the like are oriented in the direction of thickness of an insulating film and dispersed therein. When the orientation of the dispersed conductive particles is insufficient, however, an electric connection between the electrode of semiconductor element and a lead of film carrier becomes uncertain, thus posing problems in terms of connection reliability.

On the other hand, a method comprising forming a bump on the lead side of film carrier and directly connecting the bump to an electrode of semiconductor element. When wiring of semiconductor element is fine-pitched or highly dense, however, this method is faced with a difficulty in forming a circuit and/or bump corresponding to such semiconductor element on a film carrier, and also requires much attention during connecting operation.

When a conventional film carrier having a wire circuit and/or a bump set on an insulating film surface is used, moreover, outer lead bonding area generally becomes greater than inner lead bonding area, so that the final mounting area becomes greater than the size (area) of the semiconductor element, which in turn makes it difficult to satisfy a possible future demand for miniaturization.

A semiconductor element after mounting is often protected by sealing the entirety of the semiconductor element. A conventional film carrier has an exposed conductive circuit, so that an insulating resin to be used for sealing comes into direct contact with the conductive circuit. Inasmuch as the insulating resin and the metallic material forming the conductive circuit show low adhesion property, water in the air and the like penetrates into the interface thereof to possibly degrade the reliability of the semiconductor device.

DISCLOSURE OF THE INVENTION

The present invention has been made in view of the aforementioned conventional problems and aims at providing a film carrier capable of sufficiently coping with fine-pitched and/or highly dense mounting of semiconductor element wirings and of minimizing the mounting area, and which enables certain connecting operation in inner lead bonding and/or outer lead bonding.

It is also an object of the present invention to provide a semiconductor device superior in adhesion between insulating resin used for sealing of semiconductor element and film carrier, and having high reliability.

The present inventors have found that a film carrier meeting the aforementioned object of the present invention can be produced by embedding a conductive circuit in the above-mentioned film layer rather than forming it on the surface of an insulating film, unlike conventional film carriers, so that the conductive circuit may not be exposed at the surface of the film, exposing, on the above-mentioned film surface, only an end of a conductive path connected to the embedded conductive circuit, and connecting this end to an electrode of a semiconductor element or to a land part of an external substrate, which resulted in the completion of the invention.

The present inventors have also found that a semiconductor device meeting the aforementioned objects of the present invention can be produced by mounting a semiconductor element on a semiconductor element mounting part of the above-mentioned film carrier and sealing the entirety of the semiconductor element with an insulating resin, thereby completing the semiconductor device of the present invention.

That is, the present invention provides a film carrier wherein a conductive circuit is embedded in an insulator layer without being exposed at the surface of the insulator layer, and conductive paths are formed which reach both surfaces of the above-mentioned insulator layer from said conductive circuit.

In particular, the present invention provides a film carrier wherein the surface of the aforementioned insulator layer at the semiconductor element mounting part is processed to have a concave surface.

The present invention provides a film carrier having a through-hole formed in the aforementioned insulator layer at the semiconductor element mounting part.

The present invention also provides a semiconductor device wherein an electrode of semiconductor element is connected to one end of a conductive path of the aforementioned film carrier to mount the aforementioned semiconductor element.

In particular, the present invention provides a semiconductor device wherein the above-mentioned semiconductor element is sealed with an insulating resin.

The present invention also provides a semiconductor device wherein said insulating resin is an elastomer resin having a low elasticity.

The "semiconductor element" in the present invention is exemplified by a collection of semiconductor elements (e.g., silicon tip after dicing), circuit substrate for mounting a semiconductor device, circuit substrate for LCD, fine-pitched circuit substrate (e.g. hybrid IC), and the like. The "conductive circuit" includes not only pattern wirings but electrodes, leads and the like.

According to the film carrier of the present invention, the pattern of conductive circuit can be freely designed irrespective of the pattern of semiconductor element, since the conductive circuit is embedded in an insulator layer so that it will not be exposed at the surface thereof, and conductive paths are formed to reach the both surfaces of the aforementioned insulator layer from the aforementioned conductive circuit. In addition, by providing the conductive circuits in multiple layers, a three dimensional design is facilitated, thus sufficiently coping with the demand for fine-pitched and/or highly dense mounting.

An insulating resin sealing the semiconductor element does not come into contact with the conductive circuit, but an insulating resin and an insulator layer are in direct contact with each other to form an interface. As a consequence, the insulating resin and insulator layer show superior adhesion to prevent penetration of water etc. into the interface, which ultimately improves the reliability of the semiconductor device to a great extent.

When the surface of the insulator layer at the semiconductor element mounting part has been processed to have a concave part, in particular, a semiconductor element is mounted by dropping same into the concave part, whereby the electrode of the semiconductor element and one end of the conductive path are connected, thus facilitating the positioning as well as improving connection reliability.

When a through-hole is formed in the aforementioned insulator layer at the semiconductor element mounting part, a semiconductor element can be sealed without catching voids. Moreover, the contact area between the insulating resin and insulator layer is increased, so that the adhesion of the insulating resin is improved.

According to the inventive semiconductor device, the demand for fine-pitched and/or highly dense mounting can be sufficiently satisfied, since the above-mentioned semiconductor element is mounted in such a manner that the electrode of the semiconductor element is connected to one end of the conductive path of the above-mentioned film carrier.

Particularly, when the above-mentioned semiconductor element is sealed with an insulating resin, the insulating resin and insulator layer show superior adhesion to each other for the reason mentioned above, so that penetration of water into the interface thereof can be prevented to greatly improve the reliability of the semiconductor device.

When the above-mentioned insulating resin is an elastomer resin having a low elasticity, an adverse influence on the semiconductor element due to stress can be avoided to greatly improve the reliability of the semiconductor device.

EMBODIMENT TO WORK THE INVENTION

The present invention is explained in more detail by illustrating the embodiments to which the invention is not limited.

Figure 1:
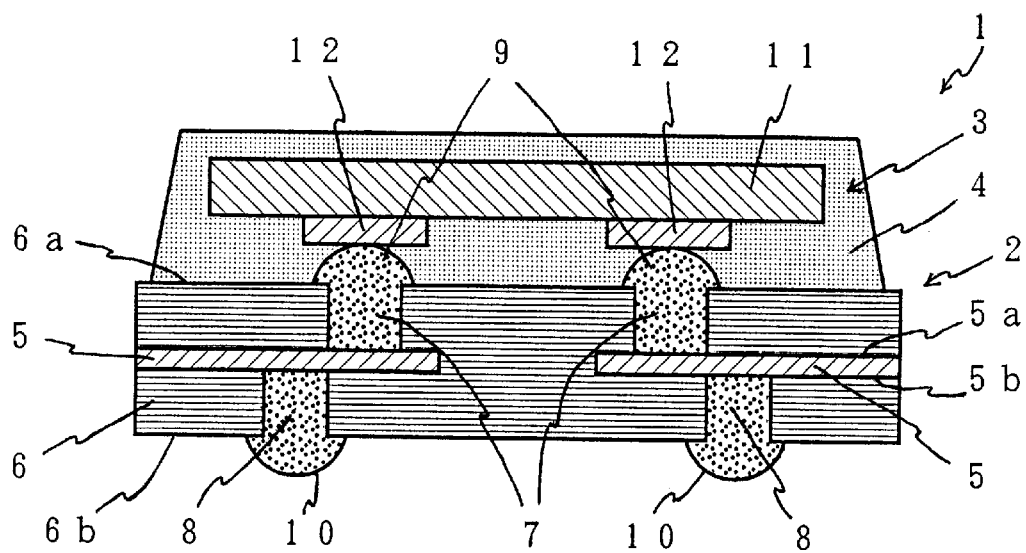
FIG. 1 is a cross sectional view showing a first embodiment of the semiconductor device using the film carrier of the present invention.

FIG. 1 is a cross sectional view showing a first embodiment of the semiconductor device using the film carrier of the present invention. The semiconductor device 1 shown in FIG. 1 comprises an anisotropic conductive film carrier 2, a semiconductor element 3 mounted on a semiconductor element mounting part of the film carrier 2, and an insulating resin layer 4 to seal the semiconductor element 3.

In the film carrier 2, a conductive circuit 5 is embedded in a flexible insulator layer 6 so that it will not be exposed at the both surfaces 6a and 6b of the insulator layer 6, and conductive paths 7 and 8 extending to the both surfaces 6a and 6b of the insulator layer 6 from the both surfaces 5a and 5b of the conductive circuit 5, are formed in a pair, wherein the paired conductive paths are positioned on the conductive circuit 5 such that they are not directly opposite to each other. The conductive paths 7 and 8 are respectively connected to bumps 9 and 10 formed to protrude outwardly from the both surfaces 6a and 6b of the insulator layer 6, and the conductive circuit 5 and bumps 9 and 10 are conducted via the conductive paths 7 and 8.

The bump 9 formed on one end of one conductive path 7 of the film carrier 2 contacts an electrode 12 formed on one surface of a substrate 11 of the semiconductor element 3 and electrically connected, whereby the semiconductor element 3 is mounted on the film carrier 2. The insulating resin layer 4 is formed on one surface 6a of the insulator layer 6 to cover the semiconductor element 3.

The bump 10 of the semiconductor device 1 thus formed is connected to the land part of an external substrate (not shown), whereby the electrode 12 of the semiconductor element 3 and the land part are electrically continued in the anisotropic direction, namely, the thickness direction of the insulator layer 6.

The material of the conductive circuit 5 is not particularly limited as long as it is conductive (e.g., metal). The thickness of the conductive circuit 5 is not particularly limited, either, but is generally 1–200 $\mu$m, preferably 5–80 $\mu$m.

The insulator layer 6 to be used for the film carrier 2 of the present invention may be formed from a material free of particular limitation as long as it can stably support the conductive circuit 5, conductive paths 7 and 8 and bumps 9 and 10, and substantially shows electrical insulation property. Specific examples include thermosetting resins and thermoplastic resins such as polyester resin, epoxy resin, urethane resin, polystyrene resin, polyethylene resin, polyamide resin, polyimide resin, acrylonitrile-butadiene-styrene (ABS) copolymer resin, polycarbonate resin, silicone resin, fluororesin and the like. Of these, polyimide resin is preferably used which is superior in heat resistance, dimensional stability on heating and mechanical strength. The insulator layer 6 may be formed from a photosensitive resin such as photosensitive polyimide resin.

While the thickness of the insulator layer 6 is not particularly limited, it is 2–500 μm, preferably 5–150 μm, to achieve sufficient mechanical strength and/or flexibility.

The conductive paths 7 and 8 and bumps 9 and 10 may be formed from any material as long as it has conductivity and may be formed from a known metallic material. For example, metals such as gold, silver, copper, platinum, lead, tin, nickel, cobalt, indium, rhodium, chromium, tungsten, ruthenium and the like, various alloys containing these, such as solder, nickel-tin and gold-cobalt, and conductive paste comprising dispersed conductive powder may be used.

Figure 2:
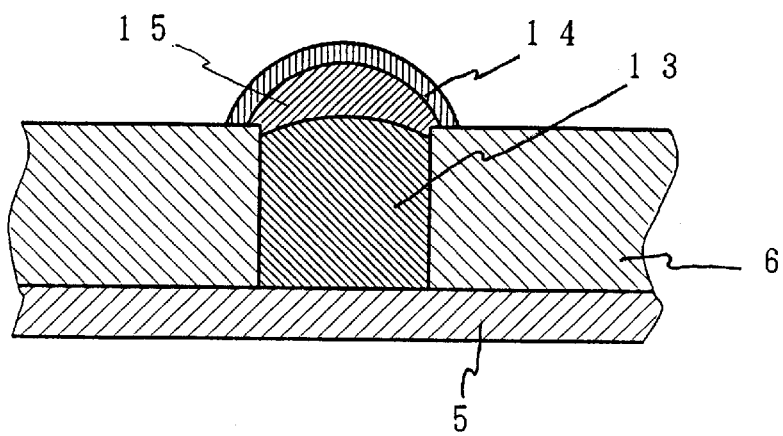
FIG. 2 is a cross sectional view in part of a modified embodiment of a bump.

The material for forming the conductive paths 7 and 8 may be the same as or different from the material forming bumps 9 and 10. Generally, the same material is used to form the both, in which case the conductive paths 7 and 8 and bumps 9 and 10 are preferably formed integrally. Alternatively, they may be formed from three kinds of materials, as shown in FIG. 2, wherein economical metallic material, such as copper, is used to form conductive path 13 to be connected to the conductive circuit 5, and a material having high connection reliability, such as gold, is used to form the surface layer 14 of the bump 9 to be connected to the electrode 12 of the semiconductor element 3. The intermediate layer 15 interposed between the conductive path 13 and surface layer 14 is formed from a metallic material, such as nickel, as a barrier to prevent interaction of the metals. They are not limited to the structure formed using the above-mentioned three kinds of materials, but may have a multi-layer structure formed from 4 or more kinds of materials.

The height of the bumps 9 and 10 is not particularly limited, but it is preferably about several μm to several dozen μm. The shape of the bumps 9 and 10 may be like mushroom (pileus) as shown in FIG. 1, semi-sphere, prism, column, sphere, cone (e.g., circular cone and pyramid) and the like. The bottom shape of the bumps 9 and 10 may be triangle, square, rectangle, trapezoid, parallelogram or other polygon.

The bumps 9 and 10 protruding outwardly from the both surfaces 6*a* and 6*b* of the insulator layer 6 are advantageous in the positioning thereof for connection to the electrode 12 of the semiconductor element 3 and/or the land part of an external substrate (not shown), and/or to achieve an ensured connection. It is needless to say that a mode wherein the respective conductive paths 7 and 8 are formed only to reach the same surface level with the both surfaces 6*a* and 6*b* of the insulator layer 6, without the end of the conductive path swollen like a bump, is encompassed in the present invention. In other words, the conductive path can be freely designed according to the layout of the semiconductor element to be mounted and/or the external substrate to be connected, and/or the shape of the circuit.

The insulating resin layer 4 to seal the semiconductor element 3 may be formed from a known material such as epoxy resin, silicone resin and the like. In this embodiment, the insulating resin layer 4 sealing the semiconductor element 3 directly comes into contact with the insulator layer 6 to form an interface, in the absence of a part in contact with the conductive circuit 5 such as a metal lead. Consequently, it is superior in adhesion to the insulator layer 6, and capable of eliminating penetration of water and the like into the interface, which in turn noticeably improves the reliability of the semiconductor device.

Figure 3:
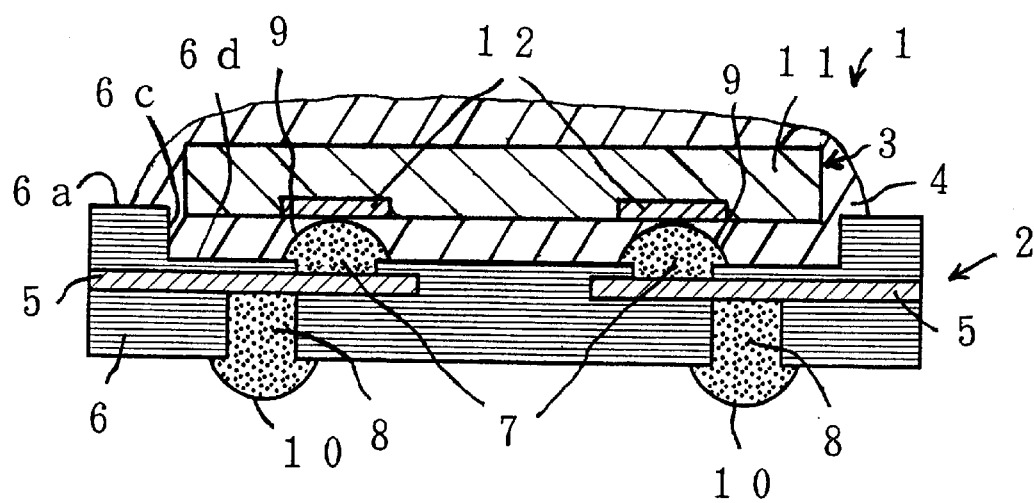
FIG. 3 is a cross sectional view showing a second embodiment of the semiconductor device using the film carrier of the present invention.

FIG. 3 is a cross sectional view showing a second embodiment of the semiconductor device using the film carrier of the present invention. In the following embodiment, the part designated with the reference symbol used in FIG. 1 shows the same or corresponding part. What is to be noted in the semiconductor device 1 shown in FIG. 3 is that a concave part 6*c* to house the semiconductor element 3 is formed on one surface 6*a* of the insulator layer 6, and a bump 9 is formed on the bottom surface 6*d* of the concave part 6*c*. The size of the concave part 6*c* should be the same as or bigger than the outer shape of the semiconductor element 3. When the semiconductor element 3 is mounted on the film carrier 2, the size and position of the electrode 11 of the semiconductor element 3 and the bump 9 of the film carrier 2 are set with accuracy so that they will not assume incorrect positions.

When the electrode 12 of the semiconductor element 3 protrudes, a multistage concave part may be formed; for example, a mating concave part is formed to fit the semiconductor element 3 into one surface 6*a* of the insulator layer 6, and then a housing concave part may be formed to house the electrode 12 of the semiconductor element 3 at the bottom of the mating concave part.

The concave part 6*c* to house the semiconductor element 3 is formed on one surface 6*a* of the insulator layer 6 on the semiconductor element 3 side, and the semiconductor element 3 is dropped into the concave part 6*c* for mounting the semiconductor element 3, whereby the electrode 11 of the semiconductor element 3 and the bump 9 of the film carrier 2 can be connected, thus extremely facilitating the positioning and/or connection, as well as improving connection reliability. When the semiconductor element 3 is mounted on the film carrier 2 to give a semiconductor device 1, the total thickness can be reduced, which is advantageous in making the device thin and light.

Figure 4:
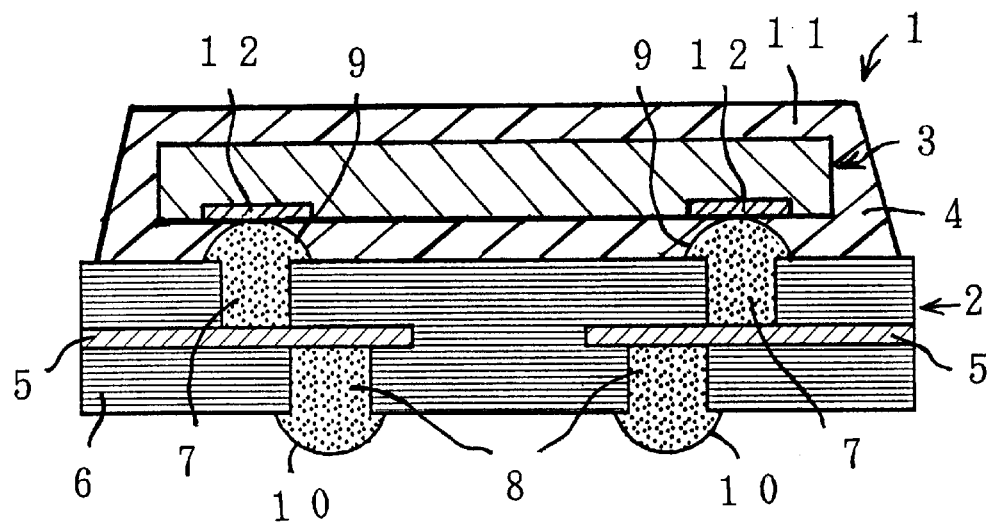
FIG. 4 is a cross sectional view showing a third embodiment of the semiconductor device using the film carrier of the present invention.

FIG. 4 is a cross sectional view showing a third embodiment of the semiconductor device using the film carrier of the present invention. What is to be noted in the semiconductor device 1 shown in FIG. 4 is that the pitch of the conductive path 8 (lower side in FIG. 4) of the outer lead bonding part is made narrower than that of the conductive path 7 (upper side in FIG. 4) of the inner lead bonding part. This design can reduce the size (area) as compared to conventional semiconductor devices.

Figure 5:
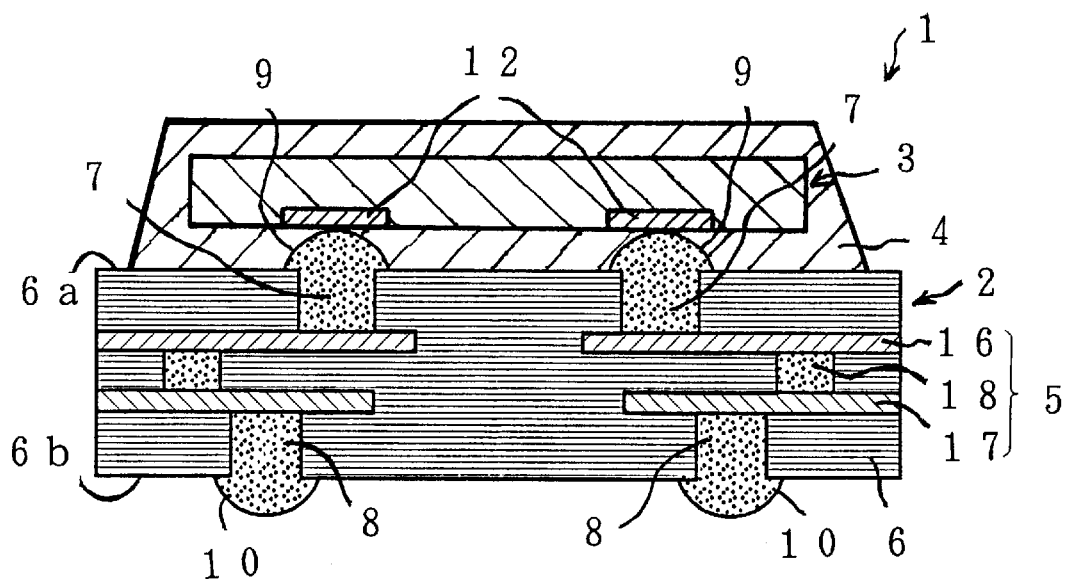
FIG. 5 is a cross sectional view showing a fourth embodiment of the semiconductor device using the film carrier of the present invention.

FIG. 5 is a cross sectional view showing a fourth embodiment of the semiconductor device using the film carrier of the present invention. What is to be noted in the semiconductor device 1 shown in FIG. 5 is that the conductive circuit 5 has a multi-layer structure. That is, the conductive circuit 5 embedded in the insulator layer 6 comprises a first and a second conductive circuits 16 and 17, which are laminated at a certain distance in the thickness direction and connected via a conductive path 18, wherein the conductive paths 7 and 8 extending to the both surfaces 6*a* and 6*b* of the insulator layer 6 are formed from the outward surface of the conductive circuits 16 and 17. Such multi-layer structure of the conductive circuit 5 is desirable in that the wiring of semiconductor element can be designed more freely than for a single layer conductive circuit 5.

Figure 6:
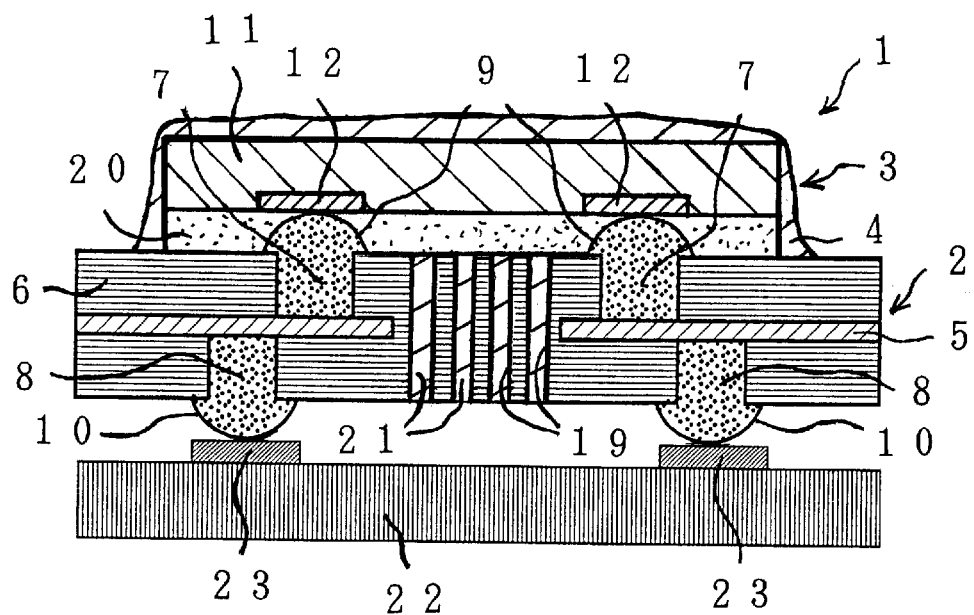
FIG. 6 is a cross sectional view showing a fifth embodiment of the semiconductor device using the film carrier of the present invention.

FIG. 6 is a cross sectional view showing a fifth embodiment of the semiconductor device 1 using the film carrier of the present invention. What is to be noted in the semiconductor device 1 shown in FIG. 6 is that a narrow through-hole 19 is formed which passes through the insulator layer 6 in the thickness direction. The size of the narrow through-hole 19 is not particularly limited as long as it does not affect the strength of the insulator layer 6. It is preferable that plural narrow through-holes 19 are formed and arranged at the same intervals to the possible extent.

By forming the narrow through-hole 19, the semiconductor element 3 can be sealed without catching voids. Moreover, since the contact area between the resin of the insulating resin layer 4 sealing the semiconductor element 3 and the insulator layer 6 can be increased to improve adhesion of the insulating resin.

In FIG. 6, an adhesive layer 20 is formed to ensure connection between the semiconductor element 3 and film carrier 2. The adhesive layer 20 may be formed from epoxy resin, fluororesin, polyimide resin and the like. The use of a thermoplastic resin which expresses adhesion property by hot pressing is preferable. The adhesive layer 20 may be previously laminated on the semiconductor element side or film carrier side, or a film-like or ribbon-like adhesive layer 20 may be used for adhesion. When the material of the adhesive layer 20 shows poor adhesion to the insulator layer 6, a sealant 21 is preferably filled in the narrow through-hole 19, so that the adhesive layer 20 can be sealed to eliminate the possibility of penetration of water through the narrow through-hole 19 into the interface thereof due to peeling off of a part of the adhesive. The material of the sealant 21 is appropriately selected according to the material of the insulator layer 6, which shows superior adhesion thereto.

The semiconductor device 1 comprising the semiconductor element 3 mounted on the film carrier 2 is connected to the external substrate 22 by connecting a bump 10 opposite to the semiconductor element 3 side to the land part 23, as shown in FIG. 6.

Figure 7:
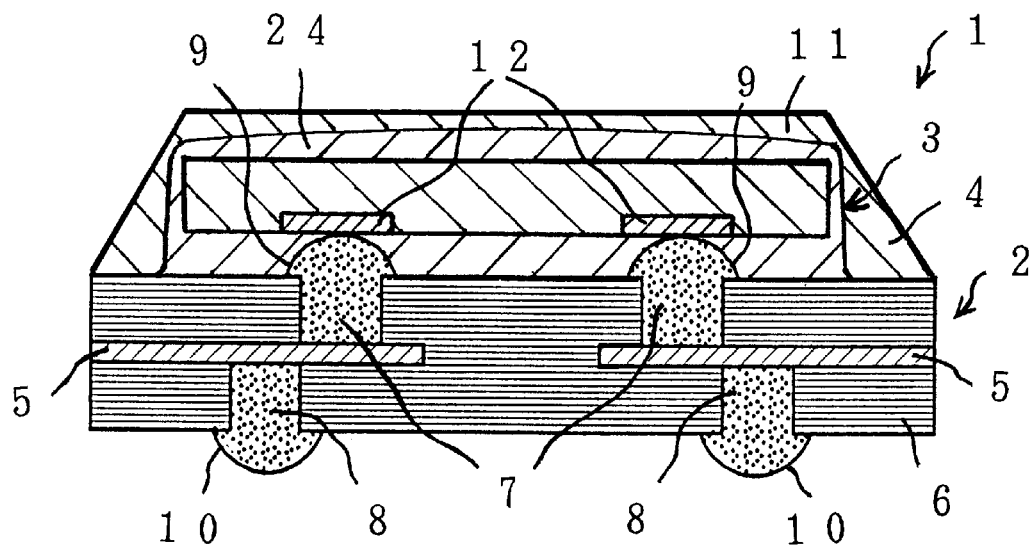
FIG. 7 is a cross sectional view showing a sixth embodiment of the semiconductor device using the film carrier of the present invention.

FIG. 7 is a cross sectional view showing a sixth embodiment of the semiconductor device using the film carrier of the present invention. What is to be noted in the semiconductor device 1 shown in FIG. 7 is that the semiconductor element 3 is covered with an elastomer resin layer 24, and the semiconductor element 3 and the elastomer resin layer 24 are covered with an insulating resin layer 4 made from a thermosetting resin such as epoxy resin. The elastomer resin layer 24 is preferably formed from fluororesin, silicone resin and the like, and a sealing method such as potting, casting and the like is preferably employed. By interposing the elastomer resin layer 24 having a low elasticity between the insulating resin layer 4 and semiconductor element 3, an adverse influence on the semiconductor element due to stress can be avoided to greatly improve the reliability of the semiconductor device, when combined with the superior adhesion property between the elastomer resin layer 24 and insulating resin layer 4 to afford strong adhesion between the two layers 4 and 24.

Figure 8:
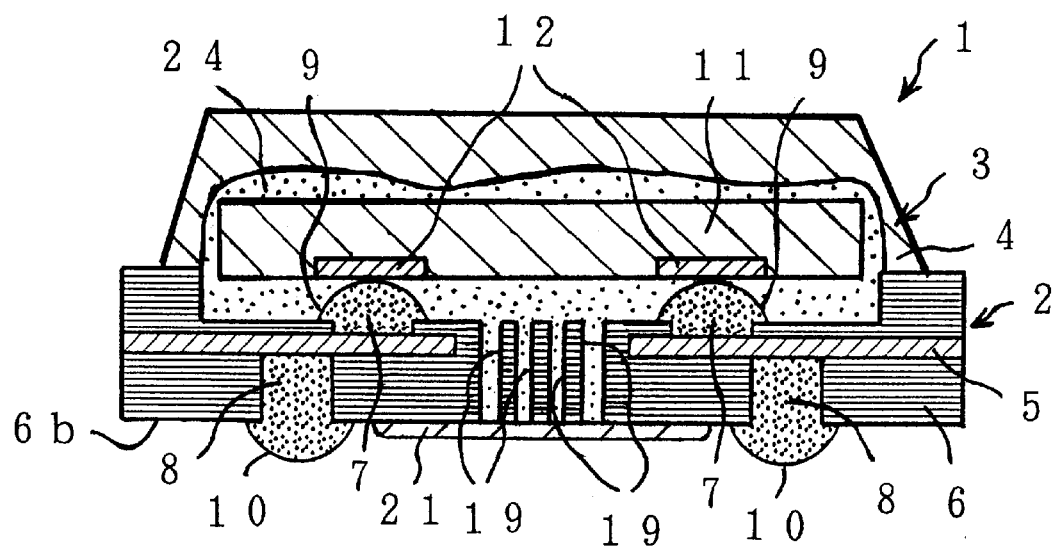
FIG. 8 is a cross sectional view showing a seventh embodiment of the semiconductor device using the film carrier of the present invention.

FIG. 8 is a cross sectional view showing a seventh embodiment of the semiconductor device using the film carrier of the present invention. The semiconductor device 1 shown in FIG. 8 is a combination of characteristic portions of respective semiconductor devices 1 shown in FIGS. 3, 6 and 7. What is to be noted in the semiconductor device 1 shown in FIG. 8 is that the elastomer resin is extended to fill the narrow through-hole 19, and the sealant 21 to seal the elastomer resin is formed on the surface 6b of the insulator layer 6, which surface 6b being opposite to the semiconductor element 3 side.

Figure 9:
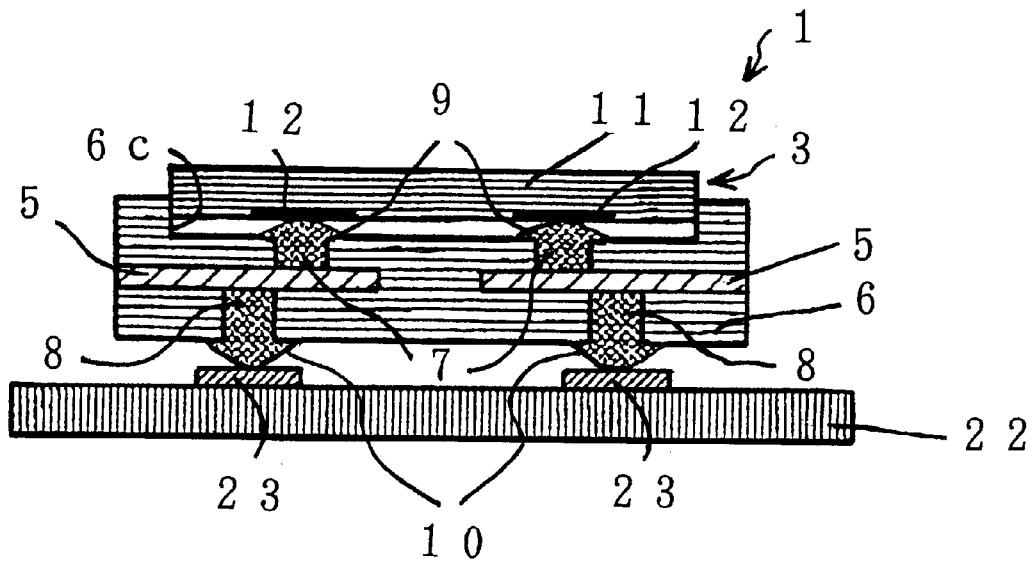
FIG. 9 is a cross sectional view showing an eighth embodiment of the semiconductor device using the film carrier of the present invention.

FIG. 9 is a cross sectional view showing an eighth embodiment of the semiconductor device using the film carrier of the present invention. As shown in FIG. 9, the mating concave part 6c is formed on one surface 6a of the insulator layer 6 to fit the semiconductor element 3, so that the semiconductor element 3 is merely dropped into the mating concave part 6c to complete the positioning for mounting. The use of solder as a conductive material for the bump 9 to be connected to the semiconductor element 3 facilitates connection of the bump 9 by only heating, thereby simplifying the process.

Figure 10:
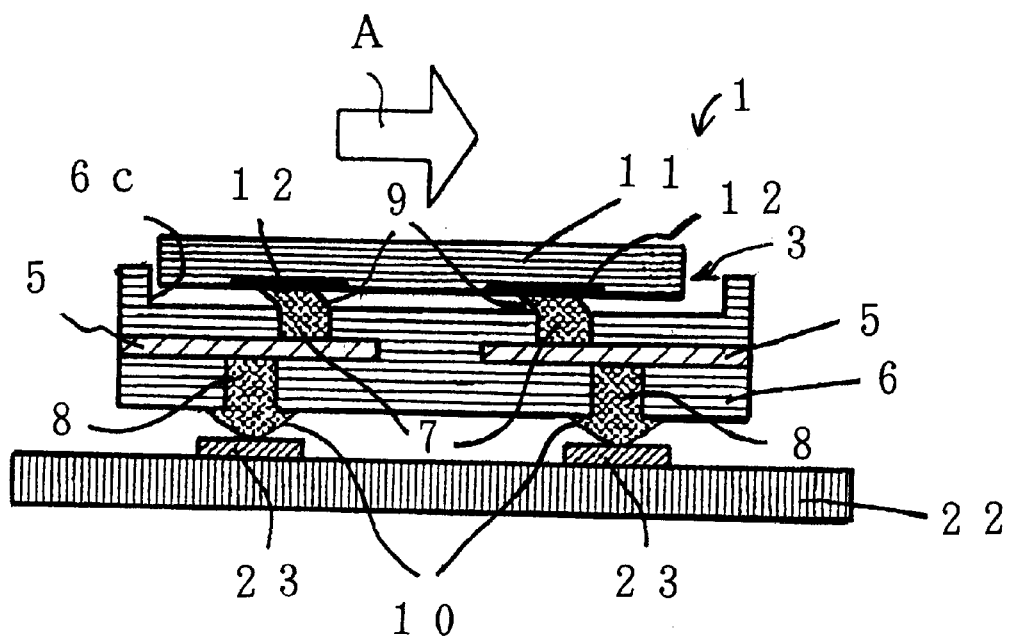
FIG. 10 is a cross sectional view showing a ninth embodiment of the semiconductor device using the film carrier of the present invention.

FIG. 10 is a cross sectional view showing a ninth embodiment of the semiconductor device using the film carrier of the present invention. When a solder bump is used, a self-alignment effect is produced by the melt-adhesion of the solder, as shown in FIG. 10, even when the size of the concave part 6c formed on one surface 6a of the insulator layer 6 is made somewhat larger than the size of the semiconductor element 3, which results in a shift of the semiconductor element 3 in the direction shown by an arrow A. Therefore, accurate positioning is not necessary.

While the film carriers 2 shown in FIGS. 1 to 10 comprise the conductive path 7 of the inner lead bonding part and the conductive path 8 of the outer lead bonding part, which are disposed at different pitches, the present invention comprises an embodiment wherein the conductive paths 7 and 8 are set at the same pitch.

Figure 11:
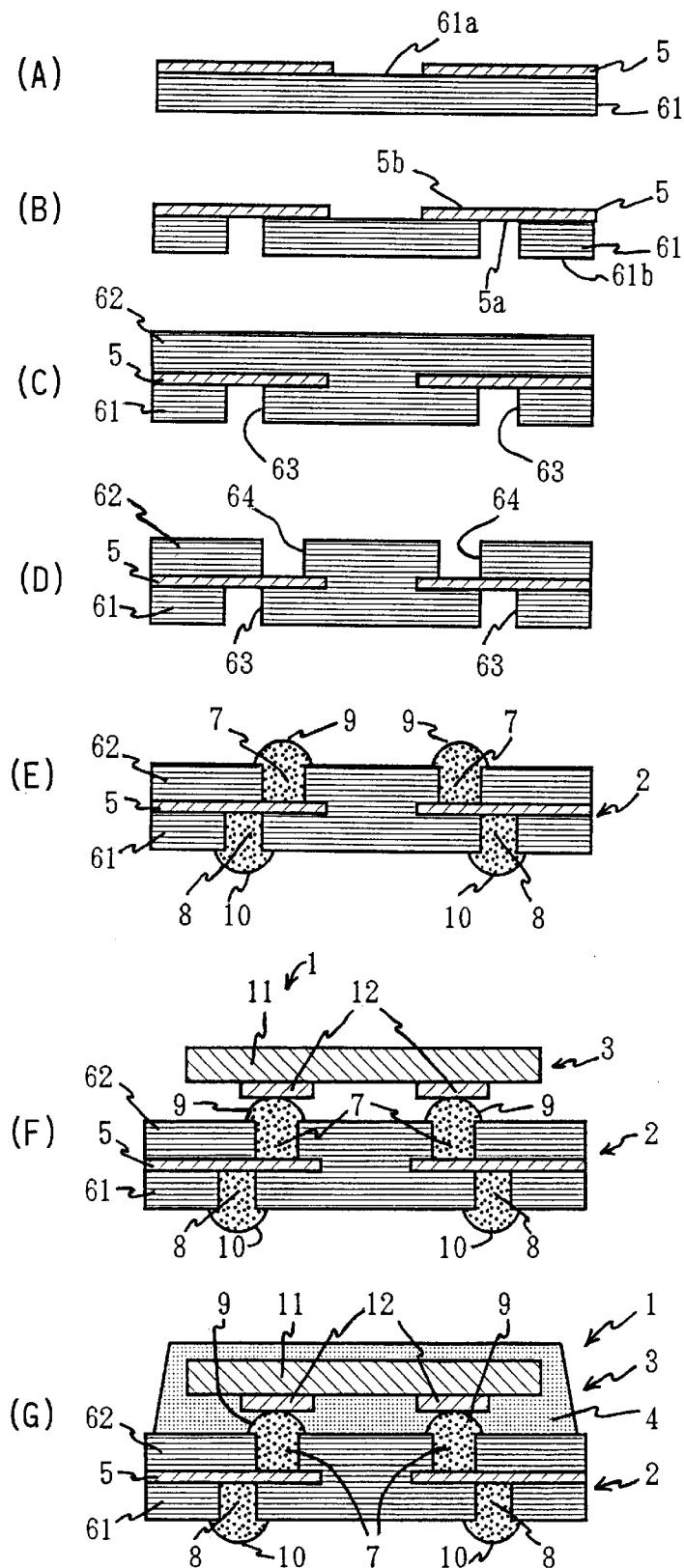
FIGS. 11(A)–(G) are a cross sectional view showing a production process of the semiconductor device shown in FIG. 1.

FIG. 11 is a cross sectional view showing a production process of the semiconductor device 1 shown in FIG. 1, which comprises the following steps.

As shown in FIG. 11(A), a conductive circuit 5 (e.g., copper circuit) is formed on one surface 61a of a first insulator layer 61 by a known method. The conductive circuit 5 is formed on one surface 61a of the first insulator layer 61 by plating method, sputtering method, CVD and the like.

Then, as shown in FIG. 11(B), a first hole 63 reaching the surface 5a of the conductive circuit 5 is formed in only the first insulator layer 61 in the area of the insulator layer 61 where a conductive path is to be formed, so that the conductive circuit 5 is exposed at the bottom of the first hole 63. The first hole 63 can be formed by mechanical perforation such as punching, photolithography processing, plasma processing, chemical etching, laser processing and the like, with preference given to laser processing which enables elaborate processing to cope with fine-pitched mounting, particularly perforation using an ultraviolet laser having an oscillation wavelength in the ultraviolet region. The size of the hole thus formed is about 5–200 $\mu$m, preferably 8–100 $\mu$m.

Then, as shown in FIG. 11(C), a second insulator layer 62 is laminated by hot pressing, extrusion molding, casting and the like, to cover the surface 5b where the conductive circuit 5 is exposed, whereby the conductive circuit 5 is embedded. The second insulator layer 62 may be formed from the same kind of resin with the first insulator layer 61 or from a different kind of resin.

The film carrier of the present invention comprises the conductive circuit 5 embedded in the insulator layer 6 and is characterized by the conductive circuit 5 which is not exposed at the both surfaces 6a and 6b of the insulator layer 6. The conductive circuit 5 is preferably embedded by laminating the first and second insulator layers 61 and 62 to sandwich the circuit, since this method facilitates production.

Thereafter, as shown in FIG. 11(D), a second hole 64 is formed in the second insulator layer 62 in the same manner as above, which reaches the surface 5b of the conductive circuit 5.

As shown in FIG. 11(E), a conductive material is filled in the first and second holes 63, 64 to form conductive paths 7 and 8 and bumps 9 and 10, thereby to give a film carrier 2.

The method for filling the conductive material in the first and second holes 63, 64 include chemical filling method such as plating method (e.g., electroplating and electroless plating), CVD, a method comprising dipping the holes in a molten metal bath to allow precipitation of conductive material, and the like; and physical filling method such as press injection of conductive material, with preference given to electroplating using the conductive circuit 5 as an electrode, in view of easiness of the process. Thus, the filling of a conductive material in the present invention encompasses not only physical filling of a conductive material but filling by chemical precipitation mentioned above.

The first and second holes 63, 64 may be formed after laminating the first and second insulator layers 61, 62, or the second hole 64 may be formed after forming the conductive path 8 and bump 10 by filling a conductive material after forming the first hole 63.

Then, as shown in FIG. 11(F), the semiconductor element 3 is mounted on the film carrier 2, and the bump 9 of the film carrier 2 and the electrode 12 of the semiconductor element 3 are connected by hot pressing, ultrasonic wave, reflowing and the like. The method for the connection is appropriately determined according to the kind of metal constituting the electrode 12.

Finally, as shown in FIG. 11(G), the circumference of the semiconductor element 3 connected to the film carrier 2 is sealed with an insulating resin layer 4 to give a semiconductor device 1. The method for sealing is a known method such as transfer molding, potting, casting and the like.

As shown in FIGS. 3 and 8 to 10, when a concave part 6c to house the semiconductor element 3 is to be formed on one surface 61a of the insulator layer 6, the method same as that for forming the first hole 63 in the process of FIG. 11(B) is employed.

Industrial Applicability

According to the film carrier of the present invention, the pattern of the conductive circuit can be freely designed irrespective of the pattern of the semiconductor element. In addition, by forming conductive circuits in multiple layers, a three dimensional design is facilitated, thus sufficiently coping with the demand for fine-pitched and/or highly dense mounting. The insulating resin used for sealing the semiconductor element and the insulator layer of the film carrier show superior adhesion property, so that the penetration of water in the air into the interface thereof can be prevented, whereby the reliability of the semiconductor device can be greatly improved.

In particular, when the surface of the above-mentioned insulator layer at the semiconductor element mounting part is processed to have a concave part, the semiconductor element is dropped into the concave part when mounting the semiconductor element on the film carrier, whereby the electrode of the semiconductor element and one end of the conductive path can be connected, thus facilitating the positioning as well as improving connection reliability.

When a through-hole is formed in the above-mentioned insulator layer at the semiconductor element mounting part, the semiconductor element can be sealed without catching voids. Moreover, the contact area between the insulating resin and insulator layer can be increased to improve the adhesion property of the insulating resin.

According to the semiconductor device of the present invention comprising the electrode of the semiconductor element connected to one end of the conductive path of the above-mentioned film carrier to mount the semiconductor element, the demand for fine-pitched and/or highly dense mounting can be sufficiently met.

Particularly, when the above-mentioned semiconductor element is sealed with an insulating resin, the insulating resin and insulator layer show superior adhesion property, so that penetration of water etc. into the interface thereof can be prevented, thereby greatly improving the reliability of the semiconductor device.

When the above-mentioned insulating resin is an elastomer resin having low elasticity, moreover, an adverse influence on the semiconductor element due to stress can be avoided, thereby greatly improving the reliability of the semiconductor device.

What is claimed is:

1. A film carrier comprising a conductive circuit embedded in a flexible insulator layer without being exposed at a surface of said flexible insulator layer, and conductive paths reaching both surfaces of said flexible insulator layer from said conductive circuit;

wherein said flexible insulator layer is formed from a thermosetting resin or thermoplastic resin;

wherein the conductive paths are formed in plural pairs, the paired conductive paths are attached to opposite surfaces of said conductive circuit and are positioned on the conductive circuit so that they are not directly opposite to each other; said flexible insulator layer having an inner surface side permitting contact with a semiconductor element and an outer surface side permitting contact with an external substrate;

and wherein the pitch of the pair of conductive paths on the outer surface side of the conductive circuit is narrower than the pitch of the pair of conductive paths on the inner surface side of the conductive circuit.

2. The film carrier of claim 1, further comprising a protrusion extending outwardly from a surface of said flexible insulator layer, the protrusion being connected to one of said conductive paths.

3. The film carrier of claim 1, further comprising a concave, semiconductor element mounting part on the surface of the flexible insulator layer.

4. The film carrier of claim 3, wherein the semiconductor element mounting part is a multistage mounting part including concave parts.

5. The film carrier of claim 1, wherein the conductive circuit has a multilayer structure wherein each layer of the conductive circuit is connected via a conductive path.

6. The film carrier of claim 3, wherein the flexible insulator layer at the semiconductor element mounting part has a through-hole.

7. The film carrier of claim 1, wherein the conductive circuit has a thickness of 1–200 μm.

8. The film carrier of claim 1, wherein the flexible insulator layer is made from a photosensitive resin.

9. The film carrier of claim 1, wherein the flexible insulator layer has a thickness of 2–500 μm.

10. The film carrier of claim 2, wherein the conductive path and the protrusion are integrally formed from the same material.

11. The film carrier of claim 2, wherein the conductive path and the protrusion form a multi-layer structure made from plural kinds of materials.

12. A semiconductor device comprising the film carrier of claim 1 and a semiconductor element mounted on said film carrier, with an electrode of the semiconductor element being connected to one end of a conductive path on the inner surface side of the film carrier.

13. The semiconductor device of claim 12, further comprising an adhesive layer interposed between the film carrier and the semiconductor element.

14. The semiconductor device of claim 12, wherein the semiconductor element is sealed with an insulating resin.

15. The semiconductor device of claim 14, wherein the insulating resin is an elastomer resin having a low elasticity.

16. The semiconductor device of claim 15, further comprising an insulating resin covering the elastomer resin.

17. A semiconductor device comprising the film carrier of claim 8 and a semiconductor element mounted on the semiconductor element mounting part, said semiconductor element being sealed with an elastomer resin.

18. The semiconductor device of claim 17, further comprising a through-hole in the film carrier, which hole is filled with a sealant.

* * * * *